United States Patent
Znojemsky et al.

(10) Patent No.: US 11,463,053 B1
(45) Date of Patent: Oct. 4, 2022

(54) ULTRA-LOW NOISE CAPACITIVELY-COUPLED AUTO-ZEROED AND CHOPPED AMPLIFIER WITH SENSOR OFFSET COMPENSATION

(71) Applicant: Allegro MicroSystems, LLC, Manchester, NH (US)

(72) Inventors: Karel Znojemsky, Ricany (CZ); Richard Stary, Dolni Brezany (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 34 days.

(21) Appl. No.: 17/236,209

(22) Filed: Apr. 21, 2021

(51) Int. Cl.
| | |
|---|---|
| H03F 1/02 | (2006.01) |
| H03F 3/387 | (2006.01) |
| H03F 1/26 | (2006.01) |
| H03F 3/45 | (2006.01) |
| H03F 3/68 | (2006.01) |
| H03F 1/30 | (2006.01) |

(52) U.S. Cl.
CPC .............. *H03F 3/387* (2013.01); *H03F 1/26* (2013.01); *H03F 3/45977* (2013.01); *H03F 3/68* (2013.01); *H03F 1/303* (2013.01); *H03F 3/45475* (2013.01); *H03F 2200/375* (2013.01)

(58) Field of Classification Search
CPC ........ H03F 3/387; H03F 1/26; H03F 3/45977; H03F 3/68; H03F 2200/375; H03F 1/02; H03F 3/45475; H03F 1/303; H03F 3/005
See application file for complete search history.

(56) References Cited

U.S. PATENT DOCUMENTS

| | | | |
|---|---|---|---|
| 7,990,209 B2 | 8/2011 | Romero | |
| 8,416,014 B2 | 4/2013 | Romero | |
| 8,604,861 B1 * | 12/2013 | Ceballos | ................... G06G 7/18 |
| | | | 327/337 |

(Continued)

OTHER PUBLICATIONS

U.S. Non-Final Office Action dated Nov. 2, 2020 for U.S. Appl. No. 16/435,884; 6 pages.

(Continued)

*Primary Examiner* — Khanh V Nguyen
(74) *Attorney, Agent, or Firm* — Daly, Crowley, Mofford & Durkee, LLP (57) ABSTRACT

In some embodiments, a circuit includes: a first chopping circuit configured to receive an input signal and generate a modulated signal responsive to the input signal; first and second input capacitors selectively coupled to receive a modulated signal or a common-mode voltage; an amplifier having an input and an output, the input coupled to the first and second input capacitors; an auto-zeroing circuit comprising one or more auto-zeroing feedback capacitors selectively coupled between the amplifier input and output; a gain selection circuit comprising one or more gain selection feedback capacitors coupled to the amplifier input and selectively coupled to the amplifier output or the common-mode voltage; an offset compensation circuit comprising one or more offset capacitors coupled to the amplifier input and selectively coupled to a reference voltage or the common-mode voltage; and a second chopping circuit configured to generate a demodulated signal responsive to the amplifier output.

16 Claims, 6 Drawing Sheets

(56) References Cited

U.S. PATENT DOCUMENTS

| | | | | |
|---|---|---|---|---|
| 8,791,754 | B2* | 7/2014 | Lyden | H03G 3/008 |
| | | | | 330/9 |
| 9,071,208 | B2* | 6/2015 | Nagahisa | H03F 3/387 |
| 9,729,109 | B2* | 8/2017 | Shu | H03F 3/45968 |
| 10,495,701 | B2 | 12/2019 | Romero | |
| 2004/0032294 | A1 | 2/2004 | Rossi | |
| 2020/0389139 | A1 | 12/2020 | Drinovsky et al. | |

OTHER PUBLICATIONS

Response to U.S. Non-Final Office Action dated Nov. 2, 2020 for U.S. Appl. No. 16/435,884; Response filed on Dec. 3, 2020; 11 pages.

Notice of Allowance dated Dec. 23, 2020 for U.S. Appl. No. 16/435,884; 7 pages.

Jiang, et al. "An Energy-Efficient 3.7-nV/$\sqrt{Hz}$ Bridge Readout IC With a Stable Bridge Offset Compensation Scheme;" IEEE Journal of Solid-State Circuits, vol. 54, No. 3; Mar. 2019; 9 pages.

\* cited by examiner

ULTRA-LOW NOISE CAPACITIVELY-COUPLED AUTO-ZEROED AND CHOPPED AMPLIFIER WITH SENSOR OFFSET COMPENSATION

BACKGROUND

Sensors are used to perform various functions in a variety of applications. Sensors generally include one or more sensing elements and electronic circuitry for processing signals from the sensing elements to generate one or more output signals indicative of the sensed parameter. Some sensors can be provided in the form of integrated circuits (IC) that incorporate the sensing elements within the IC package (e.g., supported by a semiconductor die), in which case the sensor can be referred to as a sensor IC. Other sensors can include one or more ICs that interface with external sensing elements, in which case the IC can be referred to as an interface IC. Sensors are widely used in automobile control systems and other safety critical applications.

A Wheatstone bridge, or "resistive bridge," is an electrical circuit used to measure an unknown electrical resistance by balancing two legs of a bridge circuit, one leg of which includes the unknown component. Variations on the Wheatstone bridge can be used to measure capacitance, inductance, impedance and other quantities. A Wheatstone bridge can also be used to indirectly measure physical phenomenon, such as the force, temperature, pressure, etc. For example, some pressure sensors employ a Wheatstone bridge that is comprised of a group of four resistors on a silicon etched diaphragm. As pressure is applied to the diaphragm, the resistors are stressed, which causes a measurable change in their resistance.

Many sensors include circuitry to amplify signals generated by the sensing elements such that sensor's output signal has a suitable range of magnitudes for a given application. Such sensors may be subject to direct current (DC) offset (or "drift") as well as noise (e.g., 1/f and thermal noise) introduced by the amplifier. To help eliminate offset and reduce noise, chopped amplifiers utilize switches to modulate and demodulate a signal. Auto-zeroed amplifiers can correct for DC offset in two or more clock phases. During a first phase, usually referred to as the "auto-zero" or "sampling" phase, an offset voltage is measured and stored on a capacitor. During a second phase, the measured offset voltage is subtracted from the amplifier input signal. Auto-zeroed amplifiers require some amount of time to settle after the auto-zero phase. Similarly, chopping amplifiers require time to settle after transition between chopping states. In many applications, it is desirable to have chopped, auto-zeroed amplifiers with low noise and fast settling times.

SUMMARY

Described herein are embodiments of a capacitively-coupled, chopped, auto-zeroed amplifier circuit that may exhibit less noise, faster settling times, and higher linearity compared with existing amplifier designs. Embodiments of the present disclosure may be used in low input current applications such as Wheatstone bridge pressure sensors. Disclosed embodiments allow amplifier gain and offset compensation to be adjusted programmatically enabling and disabling portions of the circuit while limiting parasitic capacitance at the amplifier input.

According to one aspect of the disclosure, a circuit may include: a first chopping circuit having an input port to receive an input signal and an output port to provide an output signal selectively corresponding to a modulated signal responsive to the input signal or to a common-mode voltage; first and second input capacitors coupled to the first chopping circuit output port; an amplifier having an input port coupled to the first and second input capacitors and an output port to provide an amplified signal responsive to the first chopping circuit output signal; an auto-zeroing circuit having one or more auto-zeroing feedback capacitors selectively coupled between the amplifier input and output ports; a gain selection circuit having one or more gain selection feedback capacitors coupled to the amplifier input port and selectively coupled to the amplifier output port or the common-mode voltage; an offset compensation circuit having one or more offset capacitors coupled to the amplifier input port and selectively coupled to a reference voltage or the common-mode voltage; and a second chopping circuit having an input port coupled to the amplifier output port and an output port to provide a demodulated signal responsive to the amplified signal.

In some embodiments, during a first phase of operation: the first chopping circuit output port provides the common-mode voltage; the one or more auto-zeroing feedback capacitors are coupled to the amplifier input and output ports; the one or more gain selection feedback capacitors are coupled to the amplifier input port and the common mode voltage, and decoupled from the amplifier output port; and the one or more offset capacitors are coupled to the amplifier input port and the common mode voltage, and decoupled from the reference voltage. During a second phase of operation: the first chopping circuit output port provides the modulated signal responsive to the input signal; the one or more auto-zeroing feedback capacitors are decoupled from the amplifier input port; the one or more gain selection feedback capacitors are coupled to the amplifier input and output ports; and the one or more offset capacitors are coupled to the amplifier input port and the reference voltage. In some embodiments, during a first subphase of the first phase of operation, the auto-zeroing circuit provides a low-impedance path between the amplifier input and output ports, the low-impedance path in parallel with the auto-zeroing feedback capacitors; and during a second subphase of the first phase of operation, auto-zeroing circuit does not provide the low-impedance path between the amplifier input and output ports, In some embodiments, the circuit can further include: a buffer circuit having an input port and an output port; a load capacitor coupled in parallel with the buffer circuit input port; a first gate to selectively couple the second chopping circuit output port to the buffer circuit input port and the load capacitor; a second gate to selectively couple the buffer output port to an input port of an analog-to-digital converter (ADC). In some embodiments, during a first phase of operation: the first gate decouples the second chopping circuit output port from the buffer circuit input port and the load capacitor, and the second gate decouples the buffer output from the input port of the ADC. During a second phase of operation: the first gate couples the second chopping circuit output port to the buffer circuit input port and the load capacitor, and the second gate couples the buffer output to the input port of the ADC.

In some embodiments, the input signal, the modulated signal, and the demodulated signal are differential signals. In some embodiments, the circuit can include one or more sensing elements that generate the input signal. In some embodiments, the one or more sensing elements include a Wheatstone bridge. In some embodiments, the gain selection circuit may include a first gain selection feedback capacitor having a first capacitance value and one or more other gain selection feedback capacitors having capacitance value that are powers of two of the first capacitance value. In some embodiments, ones of the gain selection feedback capacitors can be selectively enabled or disabled to adjust the gain of amplified signal. In some embodiments, at least one of the gain selection feedback capacitors is disabled and the gain selection circuit is configured to maintain zero voltage across one or more switches connected to the disabled gain selection feedback capacitor.

In some embodiments, the offset compensation circuit may include a first offset capacitors having a first capacitance value and one or more other offset capacitors having capacitance values that are powers of two of the first capacitance value. In some embodiments, ones of the offset capacitors can be selectively enabled or disabled to adjust an offset of the modulated signal. In some embodiments, at least one of the offset capacitors is disabled, wherein the offset compensation circuit is configured to maintain zero voltage across one or more switches connected to the disabled offset capacitor. In some embodiments, the amplifier can include an operational transconductance amplifier (OTA).

According to another aspect of the disclosure, a circuit can include: a first chopping circuit configured to receive an input signal and generate a modulated signal responsive to the input signal; first and second input capacitors selectively coupled to receive a modulated signal or a common-mode voltage; an amplifier having an input and an output, the input coupled to the first and second input capacitors; an auto-zeroing circuit having one or more auto-zeroing feedback capacitors selectively coupled between the amplifier input and output; a gain selection circuit having one or more gain selection feedback capacitors coupled to the amplifier input and selectively coupled to the amplifier output or the common-mode voltage; an offset compensation circuit having one or more offset capacitors coupled to the amplifier input and selectively coupled to a reference voltage or the common-mode voltage; and a second chopping circuit configured to generate a demodulated signal responsive to the amplifier output.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
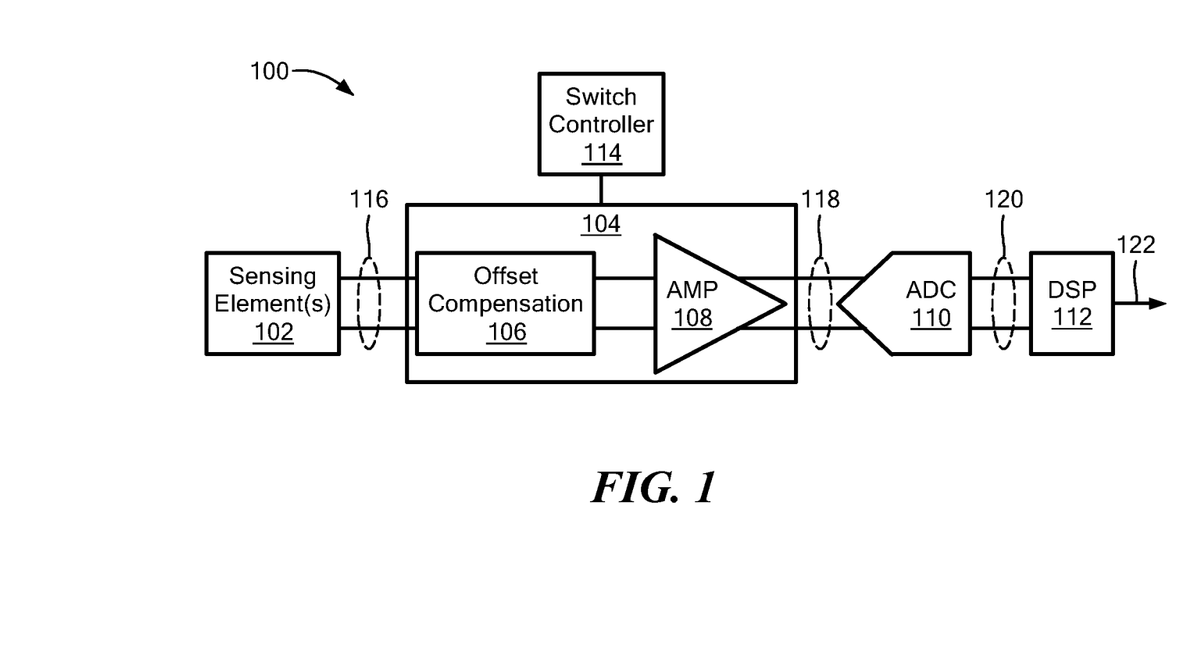
FIG. 1 is block diagram showing an example of a sensor that can include a capacitively-coupled, chopped, auto-zeroed amplifier circuit, according to some embodiments.

FIG. 1 shows an example of a sensor 100 that can include a capacitively-coupled, chopped, auto-zeroed amplifier circuit, according to some embodiments. Illustrative sensor 100 includes one or more sensing elements 102 coupled to an input of amplifier circuit 104, an analog-to-digital converter (ADC) 110 coupled to an output of amplifier circuit 104, and a digital signal processor (DSP) 112 coupled to an output of ADC 110.

Amplifier circuit 104, which is illustrated as having an offset compensation circuit 106 and an amplifier 108, can be provided as a capacitively-coupled, chopped, auto-zeroed amplifier circuit. In more detail, amplifier circuit 104 can include a plurality of switches that are switched on and off in a coordinated manner (e.g., by a switch controller 114) to reduce and ideally eliminate signal offset voltage from sensing elements 102. In this disclosure, a switch is said to be "off" when it provides a high-impedance path across its terminals. A switch is said to be "on" when it provides a low-impedance path across its terminals. Various types of electronic switches can be used within amplifier circuit 104, including but not limited to field-effect transistor (FET) switches. Switch controller 114 can generate one or more different switch control signals, such as those illustrated in FIG. 7, that are applied to control individual switches or groups of switches within amplifier circuit 104. An illustrative implementation of amplifier circuit 104 is described below in the context of FIG. 2.

Sensing elements 102 can correspond to any type of sensing elements that generate a differential voltage signal 116 in response to some sensed physical phenomenon. For example, in pressure sensor applications, sensing elements 102 may correspond to a group of four resistors on a silicon etched diaphragm (i.e., a Wheatstone bridge pressure sensor). As another example, in magnetic field sensing applications, sensing elements 102 may correspond to one or more magnetic field sensing elements (e.g., Hall effect elements or magnetoresistive elements). Other types of sensing elements can be used.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

In operation, sensing elements 102 can generate a differential voltage signal 116 having an offset voltage. The offset voltage is subtracted by offset compensation circuit 106 and amplified by amplifier 108 to produce an amplified differential signal 118. The ADC 110 can digitize amplified differential signal 118 to produce digital signal 120. The DSP 112 can include various digital components configured to perform application-specific processing of the digital signal 120 (e.g., detection, filtering, etc.) and to generate one or more output signals 122. Disclosed embodiments of a capacitively-coupled, chopped, auto-zeroed amplifier circuit find use in many applications including automobile control systems and other safety critical applications.

Figure 2:
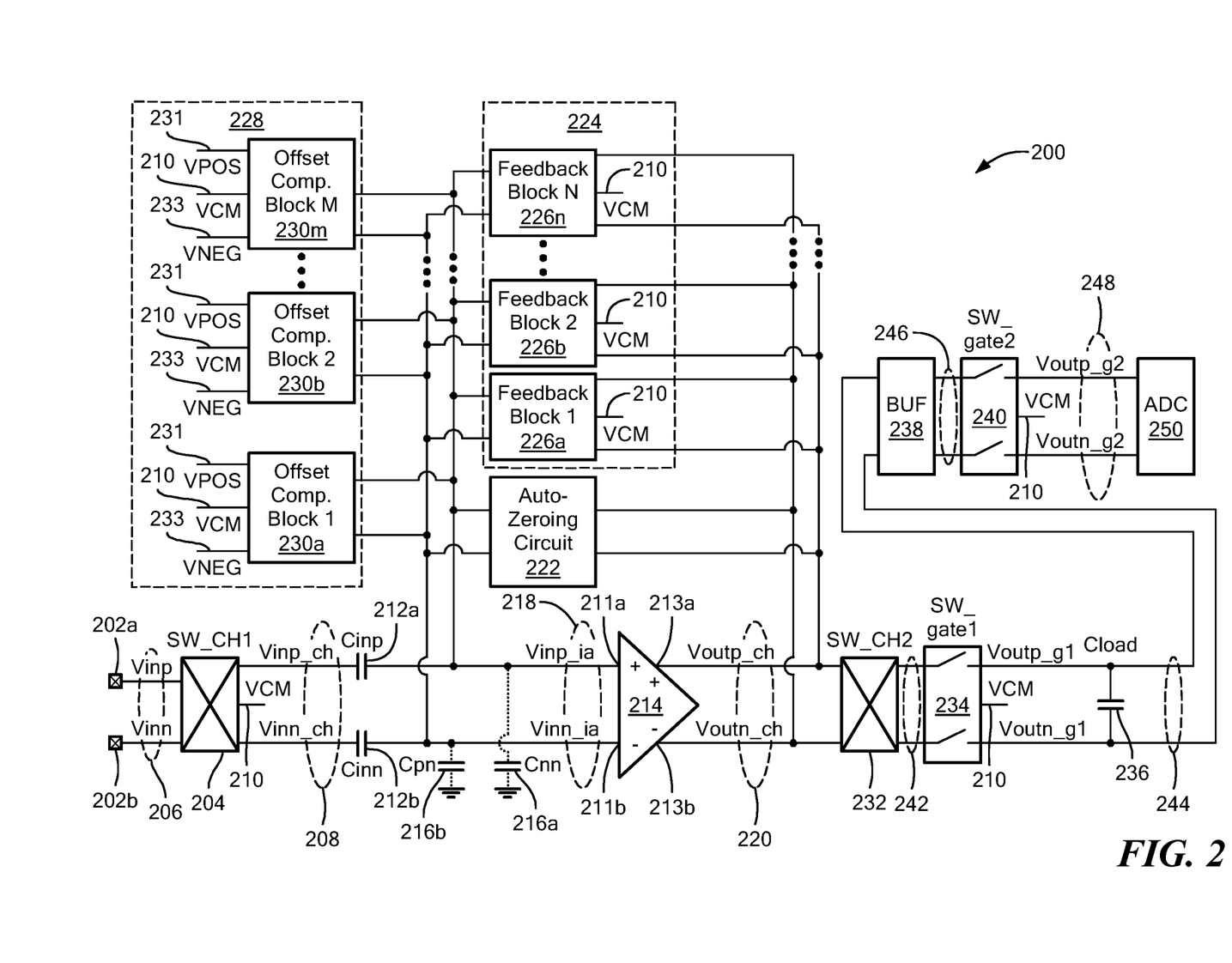
FIG. 2 is schematic diagram of a capacitively-coupled, chopped, auto-zeroed amplifier circuit, according to some embodiments.

FIG. 2 shows a capacitively-coupled, chopped, auto-zeroed amplifier circuit 200, according to some embodiments. The illustrative circuit 200 includes a first chopping circuit 204 having a differential input that includes a first (or "positive") input terminal 202a and a second (or "negative") terminal 202b. The differential input 202a, 202b is configured to receive a differential voltage signal (or "input signal") 206. Input signal 206 can be received, for example, from one or more sensing elements (e.g., sensing elements 102 of FIG. 1). First chopping circuit 204 is configured to provide an signal 208 as output. As discussed further below, during some phases of operation, signal 208 corresponds to a modulated version of input signal 206, and during other phases of operation, signal 208 corresponds to a common-mode voltage (VCM) 210. An illustrative implementation of first chopping circuit 204 is described below in the context of FIG. 3.

Circuit 200 further includes first and second input capacitors 212a, 212b coupled between an output of first chopping circuit 204 and an input of an amplifier 214. Thus, input capacitors 212a, 212b can be charged by a modulated version of differential input signal 206 (including any offset voltage) or by VCM 210. Both input capacitors 212a, 212b may have the same size, denoted $C_{in}$. In this disclosure, the "size" of a capacitor refers to its capacitance value or rating expressed, for example, in ff, pF or nF. The size of the capacitors used within circuit 200 may be selected based on a desired settling time and/or a desired amount of noise bandwidth to be limited within circuit 200. For example, smaller capacitor sizes may be selected to reduce settling time whereas larger capacitor sizes may be selected to reduce noise bandwidth. In some embodiments, $C_{in}$ can be about 5 pF.

Amplifier 214 includes a first (or "positive") input terminal 211a, a second (or "negative") input terminal 211b, a first (or "positive") output terminal 213a, and a second (or "negative") output terminal 213b. In some embodiments, amplifier 214 may be provided as an operational transconductance amplifier (OTA) and, more particularly, a low-noise OTA. Advantageous to the present disclosure, an OTA is characterized by finite transconductance, $g_m$. Amplifier 214 receives an input signal 218 that is responsive, in part, to signal 208 and generates an output signal 220 ("amplified signal") responsive to its input signal 218. The gain of amplifier circuit 200 is determined by a ratio of the input capacitances 212a, 212b and a configuration of feedback blocks 226, as discussed in detail below. In some embodiments, amplifier 214 may have a gain of about 40×.

The illustrative amplifier circuit 200 further includes an auto-zeroing (AZ) circuit 222 connected to both the input and output of amplifier 214. AZ circuit 222 can include one or more feedback capacitors and one or more switches to selectively couple the feedback capacitors to the amplifier 214 and/or provide a low-impedance path between the input and output of amplifier 214. The operation of AZ circuit 222 in described in more detail below. An illustrative implementation of AZ circuit 222 is described below in the context of FIG. 4.

Amplifier circuit 200 further includes a gain selection circuit 224 having one or more feedback blocks 226a, 226b, 226n (226 generally) that are also connected to the input and output of amplifier 214. Feedback blocks 226 can include feedback capacitors coupled to the input of amplifier 214 and switches to selectively couple the feedback capacitors to amplifier output 214 or to the VCM 210, or to uncouple the feedback capacitors (e.g., by turning all switches "off"). The operation of feedback blocks 226 is discussed in more detail below. An illustrative implementation of a feedback block 226 is described below in the context of FIG. 5.

The number (N) of feedback blocks 226 included within amplifier circuit 200 can be selected based on the desired range and resolution of gains achievable using amplifier circuit 200. In some embodiments, the size of the feedback capacitors may vary between different feedback blocks 226. For example, a first feedback block 226a may include a first pair of feedback capacitors both having a first size, $C_{fb1}$, a second feedback block 226b may include a second pair of feedback capacitors both having a second size, $C_{fb2}$, and an Nth feedback block 226n may include an Nth pair of feedback capacitors both having a Nth size, $C_{fbN}$. Different feedback blocks 226 can be selectively enabled or disabled within the circuit 200 and the gain of the amplifier circuit 200 is inversely proportional to the feedback capacitances for the enabled feedback blocks 226. More particularly, the gain is equal to the ratio of the input capacitance to the sum of the feedback capacitances (for all enabled feedback blocks), as follows:

$$G = \frac{C_{in}}{C_{fb1} + C_{fb2} + \ldots + C_{fbN}}$$

Different feedback blocks 226 can be programmatically enabled/disabled to adjust the gain of amplifier circuit 200. In some embodiments, the size of the feedback capacitors can be selected as powers of two (2) of the size of the first feedback capacitor, $C_{fb1}$, as follows:

$$C_{fb1} = 2^0 \cdot C_{fb1}$$

$$C_{fb2} = 2^1 \cdot C_{fb1}$$

. . .

$$C_{fbN} = 2^{N-1} \cdot C_{fb1}$$

In this arrangement, the gain of amplifier circuit 200 can be set to be inversely proportional to any integer multiple of $C_{fb1}$, up to a maximum of $2^N - 1$, by selectively enabling/disabling particular feedback blocks 226. For example, to set the gain to be inversely proportional to three (3) times $C_{fb1}$, the first and second feedback blocks 226a, 226b can be enabled and any other feedback blocks within the circuit 200 can be disabled, resulting in the following gain:

$$G = \frac{C_{in}}{2^0 \cdot C_{fb1} + 2^1 \cdot C_{fb1}} = \frac{C_{in}}{3C_{fb1}}$$

Amplifier circuit 200 further includes an offset compensation circuit 228 having one or more offset compensation blocks 230a, 230b, . . . , 230m (230 generally) connected to the input of amplifier 214. The offset compensation blocks 230 can include offset capacitors coupled to the input of amplifier 214 and switches to selectively couple the offset capacitors to the common-mode voltage (VCM) 210 or to reference voltages 231, 233, and also to modulate/chop the reference voltages 231, 233. In some embodiments, a positive reference voltage (VPOS) 231 may correspond to a supply voltage, and a negative reference voltage (VNEG) 233 may correspond to ground. The offset compensation blocks 230 can operate to reduce, and ideally eliminate, voltage offset within the amplifier input signal 218 (e.g., voltage offset produced by sensing elements). In more detail, signal 208 which is charged on to input capacitors 212a, 212b can include voltage offset. Offset compensation blocks 230 are configured and operated to subtract out this voltage offset prior to amplification. This, in turn, can improve voltage span utilization within the amplifier circuit 200 and reduce the signal-to-noise ratio (SNR) of an output signal generated by amplifier circuit 200. The operation of offset compensation blocks 230 is discussed in more detail below. An illustrative implementation of an offset compensation block 230 is described below in the context of FIG. 6.

The number (M) of offset compensation blocks 230 included within amplifier circuit 200 can be selected based on a desired range and resolution of voltage offset compensation to be achieved by circuit 200. In some embodiments, the size of the offset capacitors may vary between different offset compensation blocks 230. For example, a first offset compensation block 230a may include a first pair of offset compensation capacitors both having a first size, $C_{cdac1}$, a second offset compensation block 230b may include a second pair of offset compensation capacitors both having a second size, $C_{cdac2}$, and an Mth offset compensation block 230m may include an Mth pair of offset compensation capacitors both having a Mth size, $C_{cdacM}$. Similar to feedback blocks 226, individual offset compensation blocks 230 can be programmatically enabled/disabled to control the amount of offset compensation provided by amplifier circuit 200. The amount of offset compensation provided by amplifier circuit 200 may be equal to, or otherwise proportional to, the sum of the offset capacitances for the enabled offset compensation blocks 230. In some embodiments, the size of the offset compensation capacitors can be selected as powers of two (2) of the size of the first offset capacitor, $C_{cdac1}$, such that the amount of offset compensation provided by circuit 200 can be set to any integer multiple of $C_{cdac1}$, up to a maximum of $2^M-1$, by selectively enabling/disabling particular offset compensation blocks 230.

Thus, amplifier circuit 200 can be configured for various gains by enabling/disabling different feedback blocks 226 and can also be configured for various levels of offset compensation by enabling/disabling different offset compensation blocks 230.

Amplifier circuit 200 may further include a second chopping circuit 232, a first gate 234, a load capacitor ($C_{load}$) 236, a buffer circuit 238, and a second gate 240.

Second chopping circuit 232 may be coupled to receive amplified signal 220 from amplifier 214 and configured to provide a demodulated signal 242 as output. The operation of second chopping circuit 232 is described further below. The implementation of second chopping circuit 232 may be similar to that of first chopping circuit 204, except that it does not use VCM 210.

First gate 234 may be configured to selectively couple second chopping circuit 232 to buffer circuit 238 and load capacitor 236, as shown. During startup, VCM 210 may be applied in order to reset the load capacitor 236 voltage. A signal 244 is produced by the output of first gate 234 in parallel with load capacitor 236. Signal 244 may have a relatively low frequency (i.e., it may be described as "slow") and may have a relatively low bandwidth due to amplifier 214 (e.g., an OTA) and load capacitor 236. These signal characteristics can help reduce noise bandwidth and avoid aliasing.

Buffer circuit 238 may be coupled between first gate 234 and second gate 240 and configured to generate a buffered signal 246 responsive to signal 244. Buffer circuit 238 may function to provide current to feed-up input of the ADC 250 while consuming very little (and ideally no) charge from load capacitor 236 (i.e., it may ideally have infinite input resistance). In some embodiments, buffer circuit 238 may be implemented as voltage follower.

Load capacitor 236 may be coupled in parallel with the differential output of first gate 234 and the differential input of buffer circuit 238, as shown. In this arrangement, first gate 234 can operate to connect or disconnect load capacitor 236 and buffer circuit 238 from the amplifier 214.

Second gate 240 may be coupled to receive the buffered signal 246 and to provide, as an amplifier output signal 248, either the buffered signal 246 or the VCM 210. The amplifier output signal 248 can be provided, for example, to an analog-to-digital converter (ADC) 250. The ADC 250 can be provided as part of the amplifier circuit 200 or as an external circuit/device. In this arrangement, second gate 240 may operate to selectively connect or disconnect ADC 250 from amplifier circuit 200.

The illustrative amplifier circuit 200 is not limited to use with any particular type of sensing elements, and may be used in non-sensor applications. In general, amplifier circuit 200 can be used to amplify any differential voltage signal provided at differential inputs 202a, 202b.

The illustrative amplifier circuit 200 can operate in multiple phases defined by which of the circuit's switches and gates are on or off at any given point in time. During an AZ phase, an operating point of the amplifier circuit 200 can be established. In more detail, the VCM 210, the input offset voltage of amplifier 214, and low-frequency (1/f) noise of the amplifier 214 can be sampled by input capacitors 212a and 212b connected to respective amplifier input terminals 211a and 211b. These values may also be sampled by other capacitors in the circuit 200 such as capacitors within offset compensation blocks 230. The AZ phase can include two subphases. During a first AZ subphase, AZ circuit 222 can be switched so as to provide fast settling of the operating point (e.g., fast sampling of VCM 210 at amplifier inputs 211a, 211b). During a second AZ subphase, AZ circuit 222 can be switched so as to reduce the bandwidth and noise sampled during the AZ phase and also to increase the stability of the amplifier circuit near the end of the AZ phase.

Following the AZ phase, the amplifier circuit 200 can operate in a chopping phase wherein first chopping circuit 204 is switched in an alternating manner to modulate/chop input signal 206 and second chopping circuit 232 is synchronously switched to generate demodulated signal 242. The chopping phase can include two subphases or half periods. During transition from one chopping subphase to another, disabled feedback blocks 226 and disabled offset compensation blocks 230 may be switched off to minimize parasitic capacitances 216a, 216b introduced at the amplifier inputs 211a, 211b (during the AZ phase, disabled feedback blocks 226 and disabled offset compensation blocks 230 may be connected to VCM, according to some embodiments). Reducing parasitic capacitances 216a, 216b at amplifier inputs 211a, 211b with respect to the input capacitances 212a, 212b can improve the performance of circuit 200 because parasitic capacitance can negatively impact input referred noise of circuit 200.

Amplifier circuit 200 may require time to settle after transitioning between phases and subphases (e.g., between different switch configurations/states). This period of time is referred to herein as a "settling period." Following transition from the AZ phase to the chopping phase, and following transition from one chopping subphase to another, first gate 234 may be briefly switched "off" to disconnect load capacitor 236 from amplifier 214, thereby reducing the amount of time required for settling. These periods are referred to herein as "signal transition periods." First gate 234 may also be switched off during the entirety of the AZ phase. During other times, first gate 234 can be switched "on" so as to connect load capacitor 236 to amplifier 214, thereby reducing bandwidth of the circuit including bandwidth of the noise. During the settling periods, which generally coincide with, but are longer than, the signal transition periods, second gate 240 may be switched "off" such that the ADC 250 samples VCM 210 rather than signal 246. This can improve the linearity of amplifier circuit 200 across temperature because spikes created during phase transition are excluded from the analog-to-digital conversion. Second gate 240 may also be switched off during the entirety of the AZ phase.

Further details on the operation of amplifier circuit 200 are provided below in the context of FIGS. 3-7.

Figure 3:
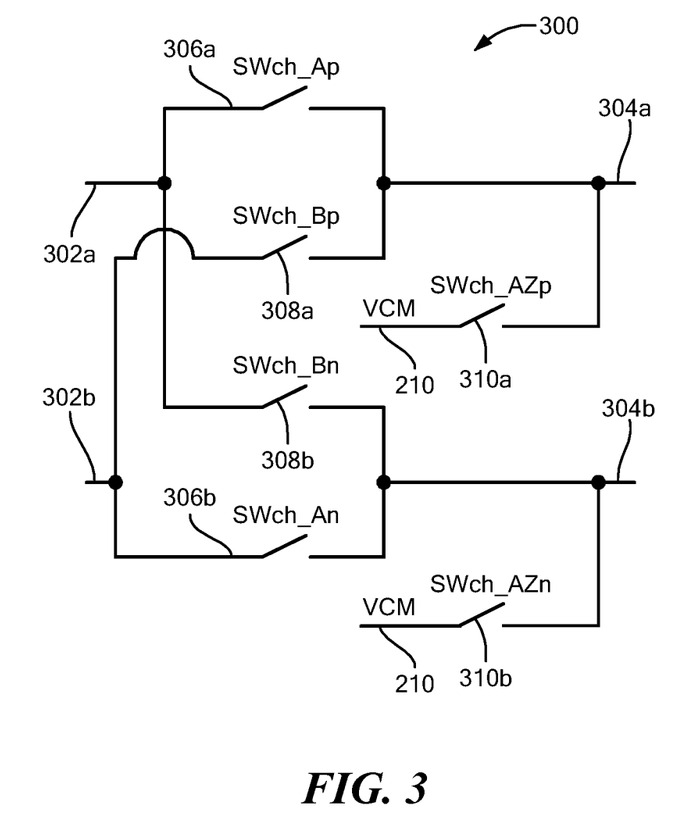
FIG. 3 is schematic diagram of a chopping circuit that can be provided within the amplifier circuit of FIG. 2, according to some embodiments.

FIG. 3 show an example of a chopping circuit that can be provided within a capacitively-coupled, chopped, auto-zeroed amplifier circuit, such as amplifier circuit of FIG. 2. An illustrative chopping circuit 300 may include a differential input comprising a first (or "positive") input terminal 302a and a second (or "negative") input terminal 302b, and a differential output comprising a first (or "positive") output terminal 304a and a second (or "negative") output terminal 304b. The chopping circuit 300 also includes a first pair of chopping switches 306a, 306b, a second pair of chopping switches 308a, 308b, and a pair of AZ switches 310a, 310b.

During the AZ phase, the first pair of switches 306a, 306b and the second pair of switches 308a, 308b may be off, and AZ switches 310a, 310b may be on. In this arrangement, output terminals 304a, 304b are connected to VCM 210.

During the chopping phase, AZ switches 310a, 310b may be off, and the first pair of switches 306a, 306b and the second pair of switches 308a, 308b may be alternately switched on and off to chop a differential signal provided at input terminals 302a, 302b. In more detail, during a first chopping subphase, the first pair of switches 306a, 306b can be on and the second pair of switches 308a, 308b can be off such that the positive input terminal 302a is connected to the positive output terminal 304a and the negative input terminal 302b is connected to the negative output terminal 304b. During a second chopping subphase, the first pair of switches 306a, 306b can be off and the second pair of switches 308a, 308b can be on such that the positive input terminal 302a is connected to the negative output terminal 304b and the negative input terminal 302b is connected to the positive output terminal 304a.

Figure 4:
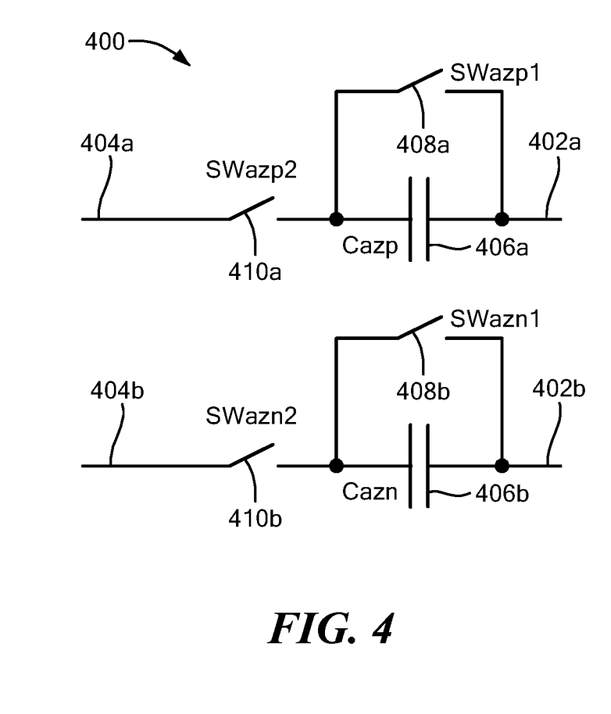
FIG. 4 is schematic diagram of an auto-zeroing (AZ) circuit that can be provided within the amplifier circuit of FIG. 2, according to some embodiments.

FIG. 4 shows an example of an AZ circuit that can be provided within a capacitively-coupled, chopped, auto-zeroed amplifier circuit, such as amplifier circuit of FIG. 2. An illustrative AZ circuit 400 can include a differential input comprising a first (or "positive") input terminal 402a and a second (or "negative") input terminal 402b, and a differential output comprising a first (or "positive") output terminal 404a and a second (or "negative") output terminal 404b. Input terminals 402a, 402b can be connected to output terminals of a differential amplifier, such as amplifier 214 of FIG. 2. For example, positive input terminal 402a can be connected to a negative output terminal of the amplifier (e.g., terminal 213b in FIG. 2) and negative input terminal 402b can be connected to a positive output terminal of the amplifier (e.g., terminal 213a in FIG. 2). Output terminals 404a, 404b can be connected to input terminals of a differential amplifier. For example, positive output terminal 404a can be connected to a positive input terminal of the amplifier (e.g., terminal 211a in FIG. 2) and negative output terminal 404b can be connected to a negative input terminal of the amplifier (e.g., terminal 211b in FIG. 2).

As shown, AZ circuit 400 may further include first and second feedback capacitors 406a, 406b connected to respective input terminals 402a, 402b; a first pair of switches 408a, 408b connected in parallel with respective feedback capacitors 406a, 406b; and a second pair of switches 410a, 410b connected to respective feedback capacitors 406a, 406b and to respective output terminals 404a, 404b. In some embodiments, feedback capacitors 406a, 406b may be of the same size. In some embodiments, the size of both feedback capacitors 406a, 406b may be about 125 fF.

During the first AZ subphase, all four switches 408a, 408b, 410a, 410b may be switched on for fast operating point settling. In this arrangement the feedback capacitors 406a, 406b are connected to both ends of the amplifier, but are shorted by low-impedance paths (i.e., by switches 408a, 408b). During the second AZ subphase, the first pair of switches 408a, 408b may be off and the second pair of switches 410a, 410b may be on such that the feedback capacitors 406a, 406b are connected to both ends of the amplifier but are not shorted. In this arrangement, the AZ circuit 400 can reduce bandwidth and noise sampled during the AZ phase and also increase the stability of the amplifier circuit near the end of the AZ phase. Thus, during the first AZ subphase, there is a low-impedance path for DC voltage (VCM output of the amplifier 214) to reach the amplifier input nodes 211a, 211b but this is not the case during the second AZ subphase.

Figure 5:
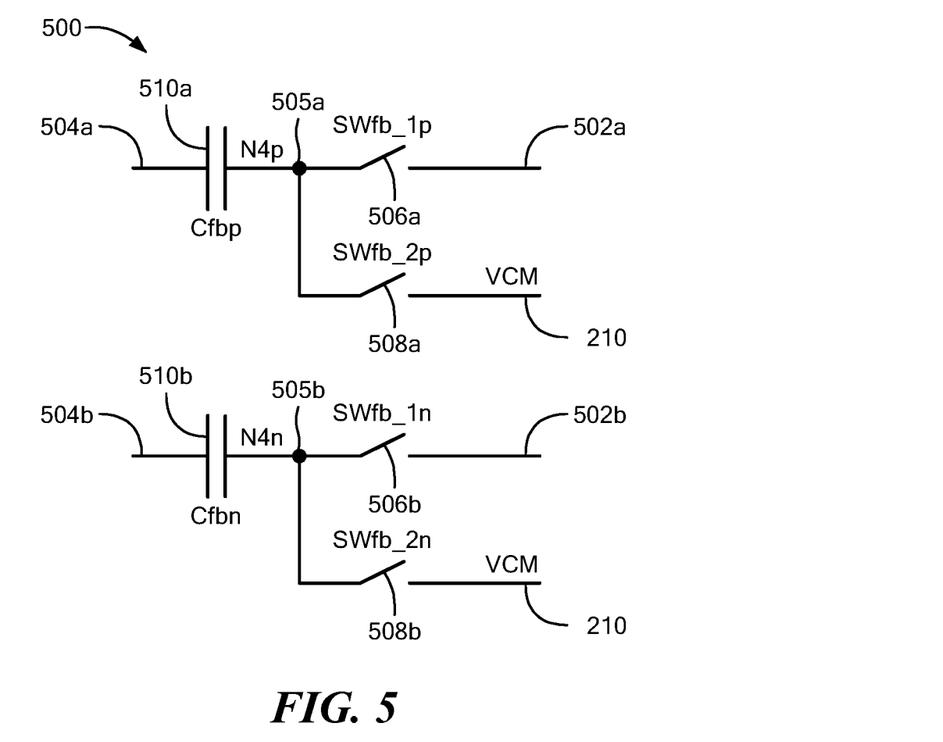
FIG. 5 is schematic diagram of a feedback block circuit can be provided within the amplifier circuit of FIG. 2, according to some embodiments.

FIG. 5 shows an example of circuit that can be implemented within a feedback block of a capacitively-coupled, chopped, auto-zeroed amplifier circuit (e.g., within a feedback block 226 of FIG. 2). An illustrative feedback block circuit 500 can include a differential input comprising a first (or "positive") input terminal 502a and a second (or "negative") input terminal 502b, and a differential output comprising a first (or "positive") output terminal 504a and a second (or "negative") output terminal 504b. Input terminals 502a, 502b can be connected to output terminals of a differential amplifier, such as amplifier 214 of FIG. 2. For example, positive input terminal 502a can be connected to a negative output terminal of the amplifier (e.g., terminal 213b in FIG. 2) and negative input terminal 502b can be connected to a positive output terminal of the amplifier (e.g., terminal 213a in FIG. 2). Output terminals 504a, 504b can be connected to input terminals of a differential amplifier. For example, positive output terminal 504a can be connected to a positive input terminal of the amplifier (e.g., terminal 211a in FIG. 2) and negative output terminal 504b can be connected to a negative input terminal of the amplifier (e.g., terminal 211b in FIG. 2).

As shown, feedback block circuit 500 can include a first pair of switches 506a, 506b connected to respective input terminals 502a, 502b; a second pair of switches 508a, 508b both connected to the VCM 210; a first feedback capacitor 510a connected between first output terminal 504a and switches 506a, 508a; and a second feedback capacitor 510b connected between second output terminal 504b and switches 506b, 508b. In some embodiments, feedback capacitors 510a, 510b may be of the same size. In some embodiments, the size of both feedback capacitors 510a, 510b may be about 125 fF.

During the AZ phase, the first pair of switches 506a, 506b may be off and the second pair of switches 508a, 508b may be on such that nodes 505a, 505b (and input terminals 502a, 502b) are connected to VCM 210. During the chopping phase, the first pair of switches 506a, 506b may be on and the second pair of switches 508a, 508b may be off. As previously mentioned, an amplifier circuit according to the present disclosure can include a plurality of feedback blocks, each of which can be enabled or disabled to achieve a target gain. In the case of a disabled feedback block, all four switches 506a, 506b, 508a, 508b may be switched off during the chopping phase to reduce/minimize parasitic capacitance (e.g., parasitic capacitance 216a, 216b of FIG. 2) that would otherwise be introduced at nodes 505a, 505b.

Figure 6:
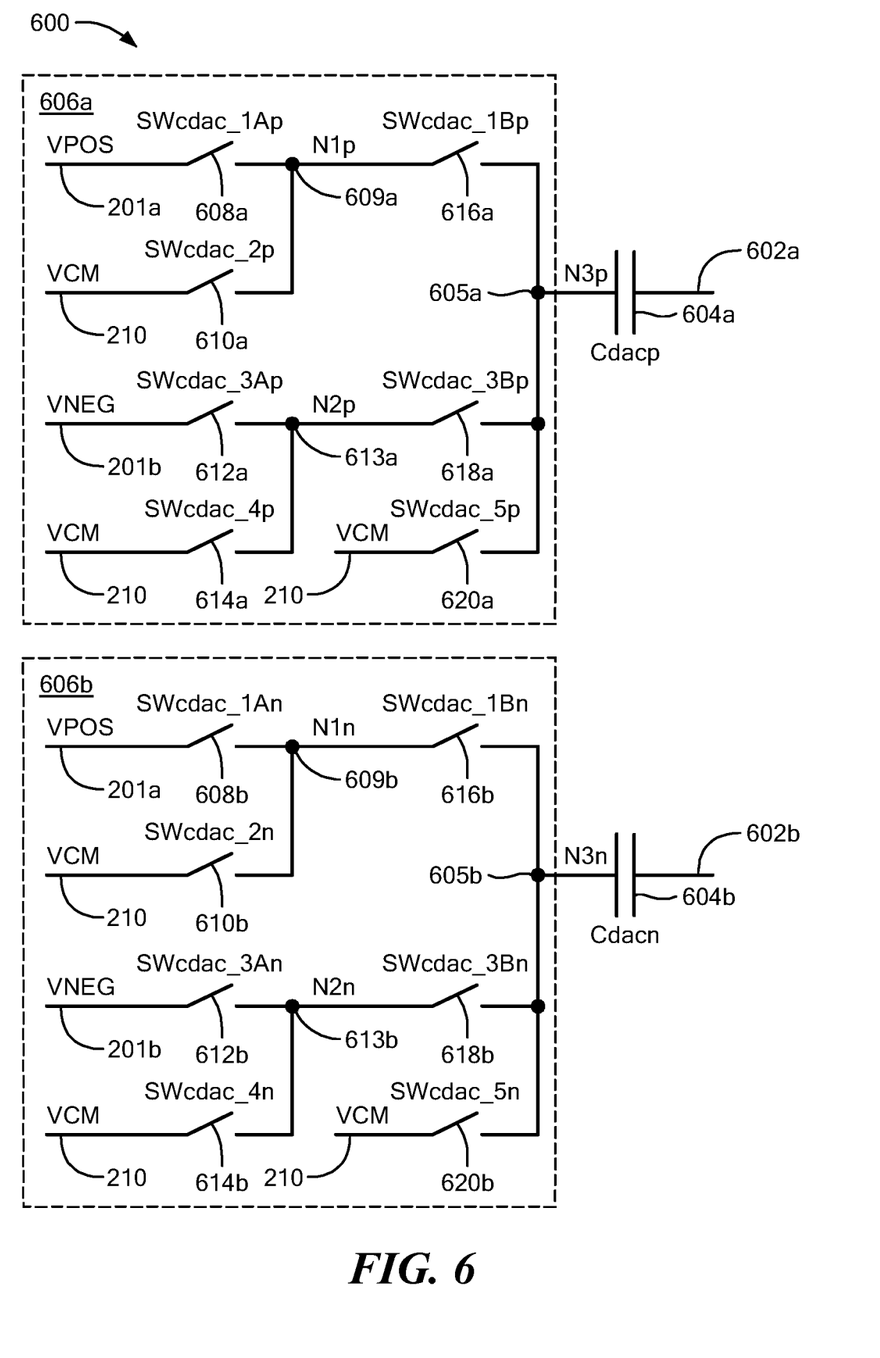
FIG. 6 is schematic diagram of an offset compensation block circuit that can be provided within the amplifier circuit of FIG. 2, according to some embodiments.

FIG. 6 shows an example of circuit that can be used within an offset compensation block of a capacitively-coupled, chopped, auto-zeroed amplifier circuit (e.g., within an offset compensation block 230 of FIG. 2). An illustrative offset compensation block circuit 600 may include a differential output comprising a first (or "positive") output terminal 602a and a second (or "negative") output terminal 602b. Output terminals 602a, 602b can be connected to input terminals of a differential amplifier, such as amplifier 214 of FIG. 2. For example, positive output terminal 602a can be connected to a positive input terminal of the amplifier (e.g., terminal 211a in FIG. 2) and negative output terminal 604b can be connected to a negative input terminal of the amplifier (e.g., terminal 211b in FIG. 2).

As shown, offset compensation block circuit 600 can include a first offset compensation capacitor 604a connected between a first switch network 606a and the first output terminal 602a, and a second offset compensation capacitor 604b connected between a second switch network 606b and the second output terminal 602b. In some embodiments, capacitors 604a, 604b may be of the same size.

Switch networks 606a, 606b may include a plurality of switches to selectively connect a reference voltage (VPOS, VNEG) 201a, 201b or a common-mode voltage (VCM) 210 to respective first nodes 605a, 605b and thus, to respective capacitors 604a, 604b. In some embodiments, a positive reference voltage (VPOS) 201a may correspond to a supply voltage and a negative reference voltage (VNEG) 201b may correspond to ground. The illustrative switch networks 606a, 606b include a first pair of switches 608a, 608b coupled to positive reference voltage 201a and respective second nodes 609a, 609b; a second pair of switches 610a, 610b coupled to VCM 210 and respective second nodes 609a, 609b; a third pair of switches 612a, 612b coupled to negative reference voltage 201b and respective third nodes 613a, 613b; a fourth pair of switches 614a, 614b coupled to VCM 210 and respective third nodes 613a, 613b; a fifth pair of switches 616a, 616b coupled between respective second nodes 609a, 609b and respective first nodes 605a, 605b; a sixth pair of switches 618a, 618b coupled between respective third nodes 613a, 613b and respective first nodes 605a, 605b; and a seventh pair of switches 620a, 620b coupled between VCM 210 and respective first nodes 605a, 605b.

During the AZ phase, the first pair of switches 608a, 608b, the third pair of switches 612a, 612b, the fifth pair of switches 616a, 616b, and the sixth pair of switches 618a, 618b may be switched off. The remaining switches 610a, 610b, 614a, 614b, 620a, 620b may be switched on during the AZ phase. In this arrangement, first nodes 605a, 605b may both be connected to VCM 210 and capacitors 604a, 604b can sample VCM 210, the input offset voltage of amplifier, and low-frequency (1/f) noise of the amplifier.

During the chopping phase, switches 610a, 610b, 614a, 614b, 620a, 620b may be off and switches 608a, 608b, 612a, 612b, 616a, 616b, 618a, 618b may be switched on and off in a periodic manner to alternately connect first nodes 605a, 605b to either positive reference voltage 201a or negative reference voltage 201b. In more detail, during a first chopping subphase, switches 608a and 616a may be on and switches 612a and 618a may be off to connect node 605a to the positive reference voltage 201a. Also during the first chopping subphase, switches 608b and 616b may be off and switches 612b and 618b may be on to connect node 605b to the negative reference voltage 201b. During a second chopping subphase, switches 608a and 616a may be off and switches 612a and 618a may be on to connect node 605a to the negative reference voltage 201b. Also during the second chopping subphase, switches 608b and 616b may be on and switches 612b and 618b may be off to connect node 605b to the positive reference voltage 201a.

As previously mentioned, an amplifier circuit according to the present disclosure can include a plurality of offset compensation blocks, each of which can be enabled or disabled to achieve a desired level of offset compensation.

In amplifier circuits where one or more switches are connected to a capacitor (e.g., capacitor 604a connected to switch 616a in FIG. 6), turning the switches off can create a high-impedance node between the switch and a capacitor (e.g., node 605a in FIG. 6). This can result in a significant noise gain from that high-impedance node to amplifier output. In some embodiments, such noise may be reduced by keeping the drain-source voltage across the "off" switches equal to 0V. This can be achieved by connecting both sides of a switch to VCM 210. Thus, for example, during the AZ phase, both sides of switches 616a, 616b, 618a, and 618b may be connected to VCM 210 by switching on switches 610a, 610b, 614a, 614b, 620a, and 620b (i.e., connecting all nodes 609a, 609b, 613a, 613b, 605a, and 605b to VCM 210). During a signal transition period, switches 620a and 620b may be off and switches 610a, 610b, 614a, 614b may be kept on because the first nodes 605a, 605b are kept at the VCM 210 (e.g., because amplifier input terminals 211a, 211b in FIG. 2 are kept at VCM during the signal transition phase by operation of first switching circuit 204). A similar approach can be used within an AZ circuit (e.g., AZ circuit 400 of FIG. 4) and/or within a feedback block circuit (e.g., feedback block circuit 500 of FIG. 5).

Figure 7:
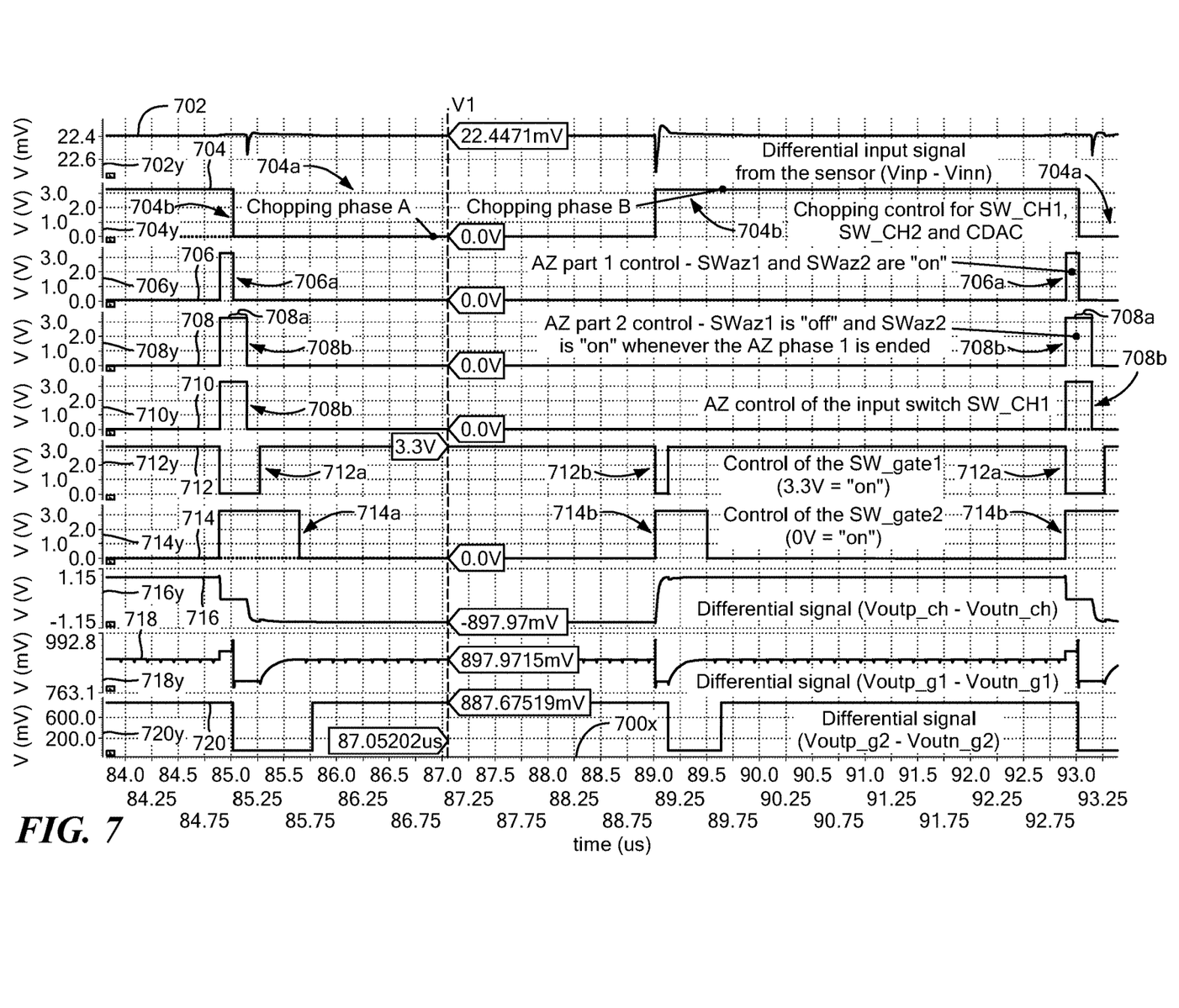
FIG. 7 is a series a stacked graphs with waveforms illustrating operation of the amplifier circuit of FIG. 2, according to the present disclosure.

FIG. 7 shows several waveforms illustrating operation of a capacitively-coupled, chopped, auto-zeroed amplifier circuit (e.g., amplifier 200 of FIG. 2). Some of the waveforms can be generated by a switch controller (e.g., switch controller 114 of FIG. 1) and applied to various switches of the amplifier circuit, as described below. Illustrative waveforms 702, 704, 706, 708, 710, 712, 714, 716, 718, 720 are shown within a series of stacked graphs that share a horizontal axis 700x representing time (in μs) and respective vertical axes 702y, 704y, 706y, 708y, 710y, 712y, 714y, 716y, 718y, 720y representing voltages.

A first waveform 702 illustrates a differential voltage signal that can be received as input to the amplifier circuit. For example, first waveform 702 may correspond to input signal 206 in FIG. 2. In some embodiments, waveform 702 may correspond to an output of one or more sensing elements, such as a Wheatstone bridge.

A second waveform 704 illustrates a chopping control signal having two subphases 704a and 704b. The subphases 704a, 704b may be of equal duration (i.e., each equal to half the period of waveform 704). In the example of FIG. 7, the chopping period is about 8 μs and both subphases 704a, 704b have a duration of about 4 μs. During a first chopping subphase 704a, waveform 704 may have a low voltage and, during a second chopping subphase 704b, waveform 704 may have a high voltage. As used herein, the term "low voltage" may refer to a voltage of 0V and the term "high voltage" may refer to a voltage greater than 0V (e.g., 3.3V). Waveform 704 may be used to control, for example, chopping circuit 300 of FIG. 3 and offset compensation block circuit 600 of FIG. 6. In more detail, waveform 704 may be used to control chopping circuit switches 306a, 306b, 308a, 308b and offset compensation block circuit switches 608a, 608b, 612a, 612b, 616a, 616b, 618a, 618b.

A third waveform 706 and a fourth waveform 708 illustrate signals that can be used to control, for example, AZ circuit 400 of FIG. 4. As shown, AZ may be performed once per chopping period and may commence around a transition from the second chopping subphase 704b to first chopping subphase 704a. During a first AZ subphase 706a, both waveforms 706, 708 may have a high voltage, causing both pairs of AZ circuit switches 408a, 408b and 410a, 410b to be switched on. During a second AZ subphase 708a, third waveform 706 may have a low voltage and fourth waveform 708 may have a high voltage, causing the first pair of AZ circuit switches 408a, 408b to be switched off while the other pair of AZ circuit switches 410a, 410b remain switched on. In the example of FIG. 7, both the first AZ subphase 706a and the second AZ subphase 708a may have a duration of about 0.125 μs. The full AZ phase, denoted 708b, may have a duration of about 0.25 μs. Also in this example, first AZ subphase 706a may end about the same time as first chopping subphase 704a begins and, thus, second AZ subphase 706b may end about 0.125 μs after the transition chopping subphase 704a begins.

A fifth waveform 710 can be used to switch on chopping circuit switches 310a, 310b (FIG. 3) during the AZ phase 708b. As shown, fifth waveform 710 may be substantially identical to fourth waveform 708. Fifth waveform 710 may also be used to turn off switches within feedback blocks 226 (e.g., switches 506a, 506b) and/or within offset compensation blocks 230 (e.g., switches 608a, 608b, 612a, 612b, 616a, 616b, 618a, 618b) during the AZ phase.

A sixth waveform 712 can be used to control a first gate of the amplifier circuit (e.g., a first gate 234 in FIG. 2). The first gate may be switched on when waveform 712 has a high voltage and off when waveform 712 has a low voltage. As previously discussed, first gate 234 may be switched off during the AZ phase and during signal transition periods to reduce settling time. Thus, as shown, waveform 712 may have a low voltage during a first signal transition period 712a that includes the AZ phase 708b and a subsequent signal transition period, and also during a second signal transition period 712b following transition between chopping subphases 704a, 704b. In this example, first signal transition period 712a has a duration of about 0.375 μs and second signal transition period 712b has a duration of about 0.125 μs.

A seventh waveform 714 can be used to control a second gate of the amplifier circuit (e.g., a second gate 240 in FIG. 2). The second gate may be switched on when waveform 714 has a low voltage and off when waveform 714 has a high voltage. As previously discussed, second gate 240 may be switched off during the AZ phase and during settling periods to improve linearity of the amplifier circuit. Thus, as shown, waveform 714 has a high voltage during a first settling period 714a that includes the AZ phase 708b and a subsequent settling period, and also during a second settling period 714b following transition between chopping subphases 704a, 704b. In this example, first settling period 714a has a duration of about 0.75 μs and second settling period 714b has a duration of about 0.5 μs.

An eighth waveform 716 illustrates a differential signal that can be generated by a differential amplifier in the amplifier circuit. For example, waveform 716 may correspond to signal 220 in FIG. 2. It can be seen that waveform 716 is modulated/chopped. As can also be seen, between times 84.875 μs and 85.125 μs (corresponding to an AZ phase), there is a plateau corresponding to V_diff=0V and Voutp_ch=Voutn_ch=VCM. Next, when the load capacitor is disconnected, there is a fast settling phase, between falling edge of 708b and rising edge of 712a (i.e., between times and 85.125 μs and 85.25 μs), following by a relatively slow settling phase when the load capacitor is connected. Similarly, there is a fast settling phase starting at the falling edge of 712b (i.e., at time 89 μs), followed by a relatively slow settling phase starting around the rising edge of 712b (i.e., at time 89.125 μs).

A ninth waveform 718 illustrates a differential signal that can be output by the first gate of the amplifier circuit. For example, waveform 718 may correspond to signal 244 in FIG. 2. It can be seen that waveform 718 is demodulated. As can be seen, there are relatively slow settling phases after the rising edges of 712a and 712b.

A tenth waveform 720 illustrates a differential output signal of the amplifier circuit. For example, waveform 720 may correspond to 248 provided to ADC 250 in FIG. 2. As can be seen, there are no "slow" settling phases in waveform 720. Instead, the ADC sees 0V during settling periods (e.g., between times and 85 μs and 85.75 μs) and about 888 mV (40× the 22.45 mV input voltage) during other times.

Disclosed embodiments can utilize an auto-zero phase that is significantly shorter, and exhibit significantly faster settling times, compared with that of existing amplifiers. For example, unlike some existing amplifiers, disclosed embodiments do not include chopping demodulation in the feedback loop. Disclosed embodiments allow amplifier gain and offset compensation to be adjusted programmatically enabling and disabling circuit blocks. When disabled, these blocks produce minimal (or ideally no) parasitic capacitance at the amplifier input.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A circuit comprising:
   a first chopping circuit having an input port to receive an input signal and an output port to provide an output signal selectively corresponding to a modulated signal responsive to the input signal or to a common-mode voltage;
   first and second input capacitors coupled to the first chopping circuit output port;
   an amplifier having an input port coupled to the first and second input capacitors and an output port to provide an amplified signal responsive to the first chopping circuit output signal;
   an auto-zeroing circuit comprising one or more auto-zeroing feedback capacitors selectively coupled between the amplifier input and output ports;
   a gain selection circuit comprising one or more gain selection feedback capacitors coupled to the amplifier input port and selectively coupled to the amplifier output port or the common-mode voltage;
   an offset compensation circuit comprising one or more offset capacitors coupled to the amplifier input port and selectively coupled to a reference voltage or the common-mode voltage; and
   a second chopping circuit having an input port coupled to the amplifier output port and an output port to provide a demodulated signal responsive to the amplified signal.

2. The circuit of claim 1,
   wherein during a first phase of operation:
      the first chopping circuit output port provides the common-mode voltage;
      the one or more auto-zeroing feedback capacitors are coupled to the amplifier input and output ports;
      the one or more gain selection feedback capacitors are coupled to the amplifier input port and the common mode voltage, and decoupled from the amplifier output port; and
      the one or more offset capacitors are coupled to the amplifier input port and the common mode voltage, and decoupled from the reference voltage;
   wherein during a second phase of operation:
      the first chopping circuit output port provides the modulated signal responsive to the input signal;
      the one or more auto-zeroing feedback capacitors are decoupled from the amplifier input port;
      the one or more gain selection feedback capacitors are coupled to the amplifier input and output ports; and
      the one or more offset capacitors are coupled to the amplifier input port and the reference voltage.

3. The circuit of claim 2,
   wherein during a first subphase of the first phase of operation, the auto-zeroing circuit provides a low-impedance path between the amplifier input and output ports, the low-impedance path in parallel with the auto-zeroing feedback capacitors; and
   wherein during a second subphase of the first phase of operation, auto-zeroing circuit does not provide the low-impedance path between the amplifier input and output ports.

4. The circuit of claim 1, further comprising:
   a buffer circuit having an input port and an output port;
   a load capacitor coupled in parallel with the buffer circuit input port;
   a first gate to selectively couple the second chopping circuit output port to the buffer circuit input port and the load capacitor;
   a second gate to selectively couple the buffer output port to an input port of an analog-to-digital converter (ADC).

5. The circuit of claim 4,
   wherein during a first phase of operation:
      the first gate decouples the second chopping circuit output port from the buffer circuit input port and the load capacitor, and
      the second gate decouples the buffer output from the input port of the ADC;
   wherein during a second phase of operation:
      the first gate couples the second chopping circuit output port to the buffer circuit input port and the load capacitor, and
      the second gate couples the buffer output to the input port of the ADC.

6. The circuit of claim 1, wherein the input signal, the modulated signal, and the demodulated signal are differential signals.

7. The circuit of claim 1, comprising one or more sensing elements that generate the input signal.

8. The circuit of claim 7, wherein the one or more sensing elements include a Wheatstone bridge.

9. The circuit of claim 1, wherein the gain selection circuit comprises a first gain selection feedback capacitor having a first capacitance value and one or more other gain selection feedback capacitors having capacitance value that are powers of two of the first capacitance value.

10. The circuit of claim 1, wherein ones of the gain selection feedback capacitors can be selectively enabled or disabled to adjust the gain of amplified signal.

11. The circuit of claim 10, wherein at least one of the gain selection feedback capacitors is disabled, wherein the gain selection circuit is configured to maintain zero voltage across one or more switches connected to the disabled gain selection feedback capacitor.

12. The circuit of claim 1, wherein the offset compensation circuit comprises a first offset capacitors having a first capacitance value and one or more other offset capacitors having capacitance values that are powers of two of the first capacitance value.

13. The circuit of claim 1, wherein ones of the offset capacitors can be selectively enabled or disabled to adjust an offset of the modulated signal.

14. The circuit of claim 13, wherein at least one of the offset capacitors is disabled, wherein the offset compensation circuit is configured to maintain zero voltage across one or more switches connected to the disabled offset capacitor.

15. The circuit of claim 1, wherein the amplifier comprises an operational transconductance amplifier (OTA).

16. A circuit comprising:
- a first chopping circuit configured to receive an input signal and generate a modulated signal responsive to the input signal;
- first and second input capacitors selectively coupled to receive a modulated signal or a common-mode voltage;
- an amplifier having an input and an output, the input coupled to the first and second input capacitors;
- an auto-zeroing circuit comprising one or more auto-zeroing feedback capacitors selectively coupled between the amplifier input and output;
- a gain selection circuit comprising one or more gain selection feedback capacitors coupled to the amplifier input and selectively coupled to the amplifier output or the common-mode voltage;
- an offset compensation circuit comprising one or more offset capacitors coupled to the amplifier input and selectively coupled to a reference voltage or the common-mode voltage; and
- a second chopping circuit configured to generate a demodulated signal responsive to the amplifier output.

* * * * *

UNITED STATES PATENT AND TRADEMARK OFFICE
CERTIFICATE OF CORRECTION

PATENT NO. : 11,463,053 B1
APPLICATION NO. : 17/236209
DATED : October 4, 2022
INVENTOR(S) : Karel Znojemsky et al.

It is certified that error appears in the above-identified patent and that said Letters Patent is hereby corrected as shown below:

In the Specification

Column 3, Line 13 delete "capacitors" and replace with --capacitor--.

Column 6, Lines 12-13 delete ", 226b, 226n" and replace with --, 226b, . . . , 226n--.

Column 6, Line 30 delete ", $C_{th2}$," and replace with --, $C_{fb2}$,--.

Column 16, Line 67 delete "capacitors" and replace with --capacitor--.

Signed and Sealed this
Twenty-first Day of November, 2023

Katherine Kelly Vidal
*Director of the United States Patent and Trademark Office*